(12) United States Patent
Dehkordi et al.

(10) Patent No.: US 11,255,877 B2
(45) Date of Patent: Feb. 22, 2022

(54) METHOD AND APPARATUS FOR TESTING PRINTED CIRCUIT BOARDS

(71) Applicant: Acculogic Corporation, Markham (CA)

(72) Inventors: Karim Dehkordi, Trabuco Canyon, CA (US); Arthur Schott, Hamburg (DE)

(73) Assignee: Acculogic Corporation, Markham (CA)

( * ) Notice: Subject to any disclaimer, the term of this patent is extended or adjusted under 35 U.S.C. 154(b) by 0 days.

(21) Appl. No.: 17/012,887

(22) Filed: Sep. 4, 2020

(65) Prior Publication Data

US 2022/0018874 A1 Jan. 20, 2022

Related U.S. Application Data

(60) Provisional application No. 63/053,005, filed on Jul. 17, 2020.

(51) Int. Cl.
*G01R 1/067* (2006.01)
*G01B 11/06* (2006.01)
(Continued)

(52) U.S. Cl.
CPC ........ *G01R 1/06705* (2013.01); *G01B 11/005* (2013.01); *G01B 11/0608* (2013.01); *G01R 1/073* (2013.01); *G01R 31/2808* (2013.01)

(58) Field of Classification Search
CPC .................. G01R 1/06705; G01R 31/2808; G01R 1/073; G01B 11/005; G01B 11/0608
(Continued)

(56) References Cited

U.S. PATENT DOCUMENTS 6,307,389 B1 10/2001 Buks et al.
2001/0028254 A1* 10/2001 Buks .................. G01R 1/06705
324/750.22
(Continued)

FOREIGN PATENT DOCUMENTS

CN 102193061 A 9/2011
WO 9624069 A1 8/1996

*Primary Examiner* — Farhana A Hoque
(74) *Attorney, Agent, or Firm* — Rankin, Hill & Clark LLP (57) ABSTRACT

A method for testing printed circuit boards (20) in a test apparatus having a carrying apparatus for the printed circuit board (20) and having test modules for measuring physical variables of components (EB) and contact points (29) on the printed circuit board (20), in which
the width of the printed circuit board (20) defines an X direction, its length defines a Y direction and its thickness defines a Z direction inside the test apparatus,
reference points, the X, Y and Z positions of which relative to the carrying apparatus are known, are present on the printed circuit board (20) or outside the latter,
the X and Y positions of the components (EB) and contact points (29) relative to the reference points are known,
the measurement of the physical variables depends on an actual Z position of the printed circuit board at the X and Y positions of the component (EB) or contact point (29) to be measured, and
the actual Z position of the printed circuit board at the X and Y positions of the component (EB) or contact point (29) to be measured is determined by means of an interpolation method starting from the X, Y and Z positions of selected reference points.

16 Claims, 10 Drawing Sheets

(51) Int. Cl.
*G01R 31/28* (2006.01)
*G01R 1/073* (2006.01)
*G01B 11/00* (2006.01)

(58) Field of Classification Search
USPC .................................................. 324/750.22
See application file for complete search history.

(56) References Cited

U.S. PATENT DOCUMENTS

| | | |
|---|---|---|
| 2002/0033706 A1* | 3/2002 | Khazei ............... G01R 29/0821 324/750.22 |
| 2002/0113613 A1* | 8/2002 | Laureanti ........... G01R 31/2831 324/750.22 |
| 2003/0035576 A1 | 2/2003 | Roder |
| 2006/0006891 A1 | 1/2006 | Ramanov et al. |
| 2006/0290368 A1 | 12/2006 | Korting et al. |

\* cited by examiner

METHOD AND APPARATUS FOR TESTING PRINTED CIRCUIT BOARDS

PRIORITY CLAIM

This application claims priority to U.S. Provisional Application. Ser. No. 63/053,005, filed Jul. 17, 2020.

BACKGROUND OF INVENTION

Field of Invention

The invention relates to a method for testing printed circuit boards. The invention also relates to an apparatus for testing printed circuit boards, in particular for carrying out the method.

Brief Description of Related Art

Printed circuit boards (PCBs) having printed or other circuits carry a multiplicity of electronic components which are connected via conductor tracks. The components themselves and contact points between the components and/or conductor tracks must be tested in the production process. For this purpose, the components and contact points are detected by means of test modules of a test apparatus. In this case, physical variables of the components and contact points are measured. Physical variables are understood as meaning, inter alia, electrical variables such as voltage, current, resistance, capacitance, inductance. In addition, temperature, geometrical dimensions, the height of components and contact points above the printed circuit board and further variables may be directly or indirectly included.

Contact points are, in particular, electrical contacts. Test tips may be provided as test modules for the purpose of testing the electrical contacts. The test tips have the function of measurement probes and make contact with selected contact points. Measurement devices connected to the test tips directly or indirectly measure electrical variables, in particular. On account of the multiplicity of contact points, a plurality of test tips may also approach different contact points at the same time.

Owing to the high level of integration and multiplicity of components on a printed circuit board, the contact points to be approached may be relatively close to one another. The test tips must therefore be positioned in an extremely accurate manner and must accurately strike the contact points to be approached. The accurate knowledge of the position of the contact points in the space, that is to say in all three spatial directions represented by the X direction, Y direction and Z direction, is required for this purpose. The X direction and Y direction are preferably intended to relate here to all directions parallel to the width and length of the printed circuit board, while the Z direction runs parallel to the thickness of the printed circuit board. In the case of a printed circuit board in a horizontal plane, the Z direction simultaneously represents the height. For simplification and for better understanding, the height is sometimes referred to below, even though the Z direction is generally meant.

The positions of the components and contact points are based on a coordinate system with a zero point on the printed circuit board or inside the test apparatus. In the last-mentioned case, each component and each contact point on the printed circuit board has a defined X position, Y position and Z position inside the test apparatus. The positions may also result indirectly if the X positions and Y positions of the components and contact points on the printed circuit board are known, which is the case, and the position of the printed circuit board inside the test apparatus is accurately known. For example, the printed circuit board inside the test apparatus is on a carrying apparatus, as a result of which the Z position of the printed circuit board relative to the test apparatus or carrying apparatus is fixed. The exact position and orientation of the printed circuit board on the carrying apparatus can be determined by detecting markings provided for this purpose on the printed circuit board, so-called fiducial marks. The position of the carrying apparatus relative to the test apparatus is moreover known or is even fixed.

Printed circuit boards consist of a relatively rigid material and are held or guided in a defined Z position during testing, with the result that components and contact points on the printed circuit board should be at an accurately defined test height. However, each printed circuit board actually has distortion and/or sagging at least caused by the production process and the fitting of the components. As a result, the components and contact points may have an actual Z position other than that expected. The deviations which occur are typically a few micrometers to several 100 μm.

If the actual Z position of the contact points deviates, it may be the case that the test tips do not reach the contact points. In addition, the test tips can also approach the contact points at an angle with respect to the Z direction, see WO 96/24069, for example at an angle of 10° with respect to the vertical in the case of a horizontal printed circuit board. If the contact point is lower than expected, the test tip moves beyond the contact point to a region beside the contact point and possibly unintentionally strikes another contact point.

If the contact point is higher than expected, the test tip reaches the printed circuit board or another contact point even before the contact point. The actual Z position of the contact points could be determined using modern metrology before the test tips approach the contact points. However, the metrological determination of the test height of each contact point would be much too time-consuming.

Components arranged on a printed circuit board, the example chips, transistors, resistors and capacitors, have a known height, that is to say a dimension in the Z direction. Metrologically checking the actual height at the assumed or known X and Y positions of a component and comparing the determined height with a desired height make it possible to estimate whether the component is actually present, whether another component is possibly present and/or whether the component has been installed incorrectly. The so-called tombstone effect is known in this context. A very small component which is soldered on the printed circuit board may stand up in the case of a defective soldering process, with the result that a considerably higher Z position than could be assumed for this component is measured. A test module for measuring the height is a laser distance meter, for example. If the latter is held in a fixed Z position relative to the test apparatus and the Z position of the printed circuit board is known, as is the geometry of the detected component, the measured Z position can be compared with the Z position of the printed circuit board and the height of the component can thus be determined.

As already mentioned above, every printed circuit board has distortion and/or sagging. The actual Z position of the printed circuit board at the X and Y positions of the component can therefore differ from the Z position of the printed circuit board defined by the carrying apparatus. Accordingly, the measurement or calculation of the height of the component relative to the printed circuit board is distorted. In order to avoid this, it would be necessary to determine the Z position of the printed circuit board directly beside the detected component and include it in the calculation. Such metrological capture of the Z position of the printed circuit board beside all components would be much too complicated and would considerably delay the method for testing the printed circuit board.

BRIEF SUMMARY OF THE INVENTION

The object of the present invention is to provide a method and an apparatus with which it is possible to determine the actual Z position of the printed circuit board at as many or arbitrary X and Y positions as possible without metrologically capturing each contact point or a point beside each component for this purpose.

In order to achieve the object, according to the method of the invention, provision is made for reference points, the X, Y and Z positions of which relative to the carrying apparatus are known, to be present on the printed circuit board or outside the latter, for the X and Y positions of the components and contact points relative to the reference points to be known, for the measurement of the physical variables to depend on an actual Z position of the printed circuit board at the X and Y positions of the component or contact point to be measured, and for the actual Z position of the printed circuit board at the X and Y positions of the component or contact point to be measured to be determined by means of an interpolation method starting from the X, Y and Z positions of selected reference points.

It is assumed that the X and Y positions of the component or contact point to be detected are known. Only the actual Z position is interpolated here. Instead of metrologically determining the actual Z position for the component to be detected or the contact point, a mathematical method, namely an interpolation, is carried out. The basis for the interpolation may be some reference points on the printed circuit board, in which case these reference points are selected arbitrarily and according to practical points of view. The reference points are intended to be suitable, in particular, for optical detection, that is to say are intended to have reflection properties which are as suitable as possible, and are intended to be selected in a sufficient number for the interpolation method. A base height as a reference variable for the actual Z position and for the Z positions of the reference points can be defined by a point or a plane inside the test apparatus or in another manner, for example also by a point at an edge of the printed circuit board or a defined distance to the point or the plane. At least one edge of the printed circuit board is advantageously on a carrying apparatus. Starting from the metrologically determined Z positions of some or all reference points, the actual Z positions of the printed circuit board at the locations of the components and contact points can be estimated more or less accurately depending on the interpolation method used. The mathematical calculations required for this purpose can be carried out in a considerably faster manner than the metrological capture of the Z positions.

The printed circuit board is preferably oriented in a horizontal manner. In this case, the thickness of the printed circuit board is simultaneously the height of the latter. The Z position of a highest surface of the component, here abbreviated to the Z position of the component, can be calculated from the actual Z position of the printed circuit board, the thickness of the printed circuit board and the height of a component. The carrying apparatus is a bearing on which the printed circuit board rests, with the result that an underside of the printed circuit board is in a plane with a top side of the bearings or the carrying apparatus. The carrying apparatus may also be a conveyor belt which is used to convey the printed circuit board along a plane. The carrying apparatus may likewise be a carrier which rests on a bearing or is conveyed by a conveyor belt and which carries the printed circuit board.

In the case of a vertically held printed circuit board, the Z direction likewise relates to the direction of the thickness of the printed circuit board. The carrying apparatus is then also accordingly vertically oriented or is in a vertical plane.

According to a further concept of the invention, an NNI method can be used as the interpolation method. NNI is the abbreviation for natural neighbor interpolation. It is an interpolation method which is also known as Voronoi interpolation. Based on the present application, this means that reference points having a known Z position are present in the vicinity of the component or contact point with the unknown Z position of the printed circuit board, which reference points are used to interpolate a value for the Z position of the printed circuit board at the location of the component or contact point. In this case, the known Z positions of the reference points are weighted in a particular manner.

According to a further concept of the invention, provision may be made for a triangulation of reference points, preferably a Delaunay triangulation, to be carried out during the interpolation. In particular, a triangulation is intended to be carried out over all reference points. The interpolation is based on the triangulation or is based on data determined by the triangulation. In particular, the triangulation is carried out as part of the NNI method or as a precursor to the NNI method. Software for carrying out a triangulation is available on the Internet using the link http://www.cs.cmu.edu/~quake/triangle.html. The triangulation is preferably intended to be carried out at least for the selected reference points.

According to a further concept of the invention, provision may be made for at least three reference points to be used for the interpolation. In principle, the X, Y and Z positions of the reference points are known. The at least three reference points are preferably all on the printed circuit board or have X and Y positions corresponding to the printed circuit board. These reference points are also referred to as internal reference points below. In contrast, reference points outside the X and Y positions of the printed circuit board are so-called external reference points below. Internal reference points are preferably used. External reference points are used, in particular, when too few internal reference points are available. For example, the point whose height (Z position) is intended to be interpolated should be inside a triangle or another polygon of reference points. The reference points can be selected accordingly.

According to a further concept of the invention, at least one internal reference point may be used for the interpolation. Further reference points may be internal or external reference points.

According to a further concept of the invention, at least one of the reference points may be an external reference point. The at least one external reference point can be used with further external reference points or with internal reference points for the interpolation. Whereas the Z positions of the internal reference points are determined by means of measurement, in particular, and the X and Y positions relative to the printed circuit board or to fiducial marks on the printed circuit board are known, the external reference points are preferably intended to be arbitrarily determined by specifying the X, Y and Z positions. For example, the X and Y coordinates of the external reference points can be selected in such a manner that the external reference points are each at a defined distance from an outer edge of the printed circuit board.

According to a further concept of the invention, a Z position corresponding to the carrying apparatus plus a constant can be assumed for the external reference point. The constant may also be zero in this case. The thickness of the printed circuit board may likewise be taken into account. The constant preferably corresponds to the thickness of the printed circuit board, in particular for all external reference points. This can simplify the calculation and can accelerate the progress of the method.

According to a further concept of the invention, at least one external reference point and at least two internal reference points can be selected for the interpolation. If a plurality of external reference points are available, that external reference point which is closest to the component or contact point and/or is opposite the selected internal reference points, based on the component or the contact point, is preferably selected.

According to a further concept of the invention, at least one internal reference point and at least two external reference points can be selected for the interpolation. If a plurality of internal reference points are available, that internal reference point which is closest to the component or contact point and/or is opposite the selected external reference points, based on the component or the contact point, is preferably selected. Moreover, the internal and external reference points, if more are available than can be selected, can be selected according to entirely different criteria. One criterion could be, for example, to form a triangle across all reference points, the angles of which do not undershoot a minimum, in particular are at least 30°. Other minimum angles can be predefined for other polygons.

According to a further concept of the invention, the Z positions of the internal reference points can be determined by means of reference measurements. In particular, the reference measurements are carried out before the measurement of the physical variables. However, it is also possible to subsequently carry out the reference measurements with subsequent determination of the actual Z positions sought.

According to a further concept of the invention, the Z positions of the internal reference points can be determined by means of laser distance measurement. A measurement apparatus provided for this purpose is calibrated relative to the carrying apparatus, in particular, with the result that the Z position of the measurement apparatus is fixed.

According to a further concept of the invention, the printed circuit board can be held in a horizontal orientation in the test apparatus during measurement. The Z direction then runs vertically. A Z position represents a height.

According to a further concept of the invention, a test tip can be used as the test module, which test tip touches the components or contact points and considers the actual interpolated Z position of the printed circuit board at this location for this purpose. Electrical variables, for example, can be detected using the test tip.

According to a further concept of the invention, the test tip can approach the components or contact points at an angle with respect to the Z direction. The angle is preferably 0-30°, in particular 5-15°.

According to a further concept of the invention, an optical distance measurement apparatus can be used as the test module, which distance measurement apparatus determines a distance from the test module to the component or contact point in the Z direction, wherein an actual height of the component or contact point in the Z direction relative to the printed circuit board is determined from the distance and the actual Z position of the printed circuit board. In this case, the difference between the actual Z position of the printed circuit board and a theoretical Z position of the printed circuit board is also taken into account. The theoretical Z position of the printed circuit board can result, for example, from a plane of the carrying apparatus plus the thickness of the printed circuit board. fiducial marks present on the printed circuit board to be detected and at least the X and Y positions of the fiducial marks to thus be captured. The X and Y positions of all components and contact points relative to the fiducial marks are determined from the printed circuit board design and are known. With knowledge of the positions of the fiducial marks relative to the carrying apparatus, the positions of the components and contact points (in the X and Y directions) relative to the carrying apparatus are then also known or can at least be calculated. The fiducial marks are preferably captured before measuring the physical variables of components and contact points.

The use of fiducial marks as reference points or the use of reference points as fiducial marks is also advantageous. For example, three fiducial marks and only two internal reference points are present. The fiducial marks can supplement the two reference points as additional internal reference points.

The invention also relates to an apparatus for testing printed circuit boards, having a test tip as a test module for making contact with contact points or components on the printed circuit board, a drive for moving the test tip to the contact points or components, and a controller for the drive. According to the invention, the controller can have, in particular, software for calculating a Z position of the contact point/component by means of interpolation so that the test tip can approach the contact point/component in its Z position.

According to a further concept of the invention, a measurement apparatus may be provided for the purpose of determining the Z position of reference points. The reference points are arranged on the printed circuit board. The measurement apparatus is preferably a laser distance measurement apparatus. The latter can be used to measure the distance between a laser head and the contact point or component in a contactless manner and in a very short time at a defined angle. The Z position of the reference point can be calculated from the distance. For this purpose, the position of the measurement apparatus relative to the test apparatus is calibrated.

The invention also relates to an apparatus for testing printed circuit boards, having a measurement apparatus as a test module for determining an actual Z position of components or contact points on the printed circuit board, wherein X and Y positions of the components and contact points on the printed circuit board are known, having a drive for moving the measurement apparatus above the components or contact points, and having a controller for the drive. The measurement apparatus is preferably a laser distance measurement apparatus. It is also possible to use the same measurement apparatus as that used to determine the Z position of the reference points on the printed circuit board. The controller may have software for calculating the Z positions of the components or contact points by means of interpolation. The measurement apparatus need not be at exactly the same X and Y positions of the respective component or contact point. In particular, in the case of a laser distance measurement apparatus having a directed measurement beam, the latter can also be at an angle with respect to the Z direction. If the angle is known, the distance and, from the latter, the actual Z position can be calculated.

According to a further concept of the invention, a measurement module may be provided for the purpose of detecting fiducial marks. The measurement module is preferably a camera which can be moved in the X and Y directions. In conjunction with image processing software, the control by means of the camera can distinguish the fiducial marks from the reference points, components and contact points and other patterns on the printed circuit board and can exactly determine the position in the X and Y directions.

BRIEF DESCRIPTION OF THE DRAWINGS

Further features of the invention moreover emerge from the description and from the claims. Advantageous exemplary embodiments of the invention are explained in more detail below on the basis of drawings, in which:

DETAILED DESCRIPTION OF THE INVENTION

Figure 1:
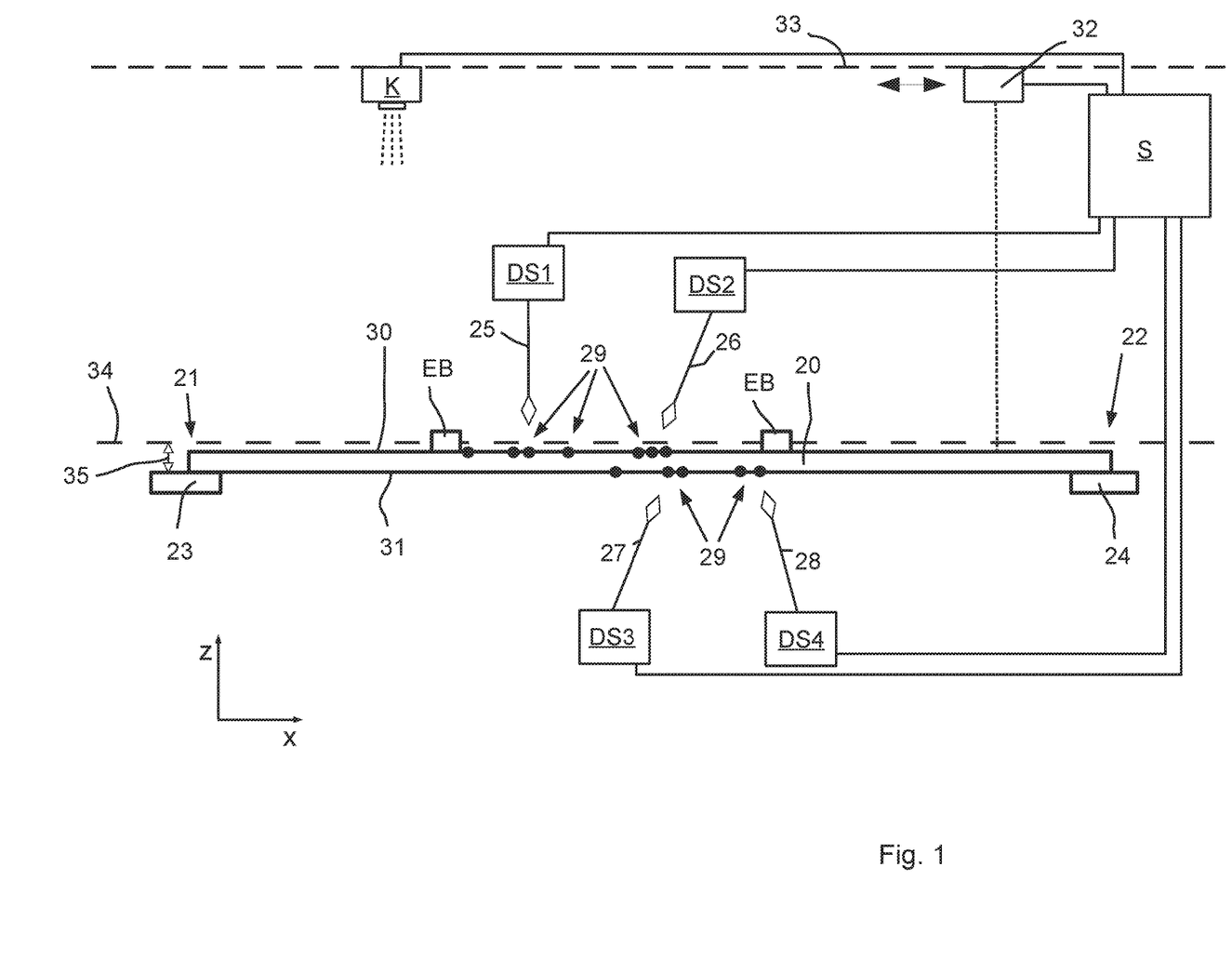
FIG. 1 shows a side view of a printed circuit board inside a test apparatus having a plurality of test tips.

In a test apparatus which is not illustrated in any more detail, a printed circuit board 20 is clearly positioned relative to the test apparatus in the region of edges 21, 22 on holders or bearings 23, 24. The bearings 23, 24 are stationary but may also be mobile parts of a conveyor which is not shown.

Directions in the space are defined by coordinates X, Y, Z. The Y coordinate is not visible in FIG. 1 since it is directed perpendicular to the plane of the image. The Z coordinate runs in the direction of a height of the printed circuit board 20, while the X coordinate here runs parallel to a width of the printed circuit board 20. The coordinates X, Y, Z are simultaneously used to define positions in the space. Starting from a zero point to be defined arbitrarily and such scaling, an X, Y, Z position denotes an accurately defined point in the space. Known X and Y positions taken together result in a defined straight line parallel to the Z direction. A known Z position defines a plane parallel to a plane spanned by the X and Y coordinates. The Z position can also be interpreted as the height above the spanned plane.

The test apparatus has four test tips 25, 26, 27, 28 which are also movable in the direction of the printed circuit board 20. Depending on the application, more or fewer test tips can be provided. At least two test tips are preferably available.

A multiplicity of contact points 29 are arranged on the printed circuit board 20. Electronic components EB and/or, in particular, printed circuits or conductor tracks are connected to said contact points. For the purpose of simplification, only two electronic components EB are illustrated in FIG. 1. The size of the components EB may be very different.

The test tips 25-28 are intended to briefly touch selected contact points 29 as test points. In this case, electrical variables can be measured and can be evaluated in order to assess faults. For example, it can thus be determined whether electrical connections between electronic components EB and the printed circuit board 20 are okay or have excessively high resistances.

The test tips 25-28 may be oriented perpendicular to the printed circuit board 20 and can be moved by drives DS1, DS2, DS3, DS4 which are not illustrated in detail, see test tip 25, and/or can be oriented and moved at an angle with respect to the vertical, see test tips 26, 27, 28, in particular as disclosed in WO 96/24069. In both cases, the test tips 25-28 must be guided in an extremely precise manner since a large number of the contact points 29 are present with very short distances on the printed circuit board 20, as are the components EB. In this case, the contact points 29 are present and depicted both on a top side 30 and on an underside 31 of the printed circuit board 20. Accordingly, test tips 25, 26 on the top side and test tips 27, 28 on the underside are provided here. Said drives DS1, DS2, DS3, DS4 are controlled by a computer controller S which has software suitable for control. No electronic components EB are depicted on the underside 31, but are nevertheless present.

The printed circuit board 20 is in itself relatively rigid. Nevertheless, the printed circuit board 20 may have distortions, in particular on account of the fitting of the electronic components EB and contact points 29 and on account of the mass of the printed circuit board. The distortions are often in the range of a few micrometers to several 100 µm. In order to measure the distortions, the test apparatus has a laser distance measurement device which is coupled to the computer controller S and has a laser measurement head 32 which can be moved in a plane 33 parallel to the printed circuit board 20. In this case, the plane 33 is adjusted relative to the bearings 23, 24 or a base height 34. The latter has a defined distance to the bearings 23, 24, see double-headed arrow 35. The base height 34 can extend along a plane which is formed by the bearings 23, 24 and in which the underside 31 of the printed circuit board ideally lies in the case of a printed circuit board 20 without distortion. Alternatively, the base height 34 may be provided above or below the bearings 23, 24. The important factor is the knowledge of the position of the plane 33 with the measurement head 32 relative to the base height 34. In the present example, the base height 34 is assumed to be above the bearings 23, 24 and therefore also above the top side 30 of the printed circuit board 20, in particular with the shortest possible distance to the top side 30.

A camera K which can be moved parallel to the plane 33 is also connected to the computer controller S. The camera K can be used to capture fiducial marks PM1, PM2, PM3 present on the printed circuit board 20, see FIG. 4. At the same time, the position of the fiducial marks PM1, PM2, PM3 is thus determined in the X and Y directions. The position of all contact points 29 and components EB on the printed circuit board 20 relative to the fiducial marks PM1, PM2, PM3 is usually known, with the result that the position of the contact points and components in the X and Y directions can be inferred from the knowledge of the position of the fiducial marks. Only the Z position, that is to say the height, is then unknown.

The measurement head 32 can be used to measure the distance of the fiducial marks PM1, PM2, PM3, contact points 29 and components EB to the measurement head 32. The height (Z position) of the fiducial marks, contact points and components can be indirectly determined from the distance. However, the distortion or sagging of the printed circuit board 20 must be taken into account.

Figure 2:
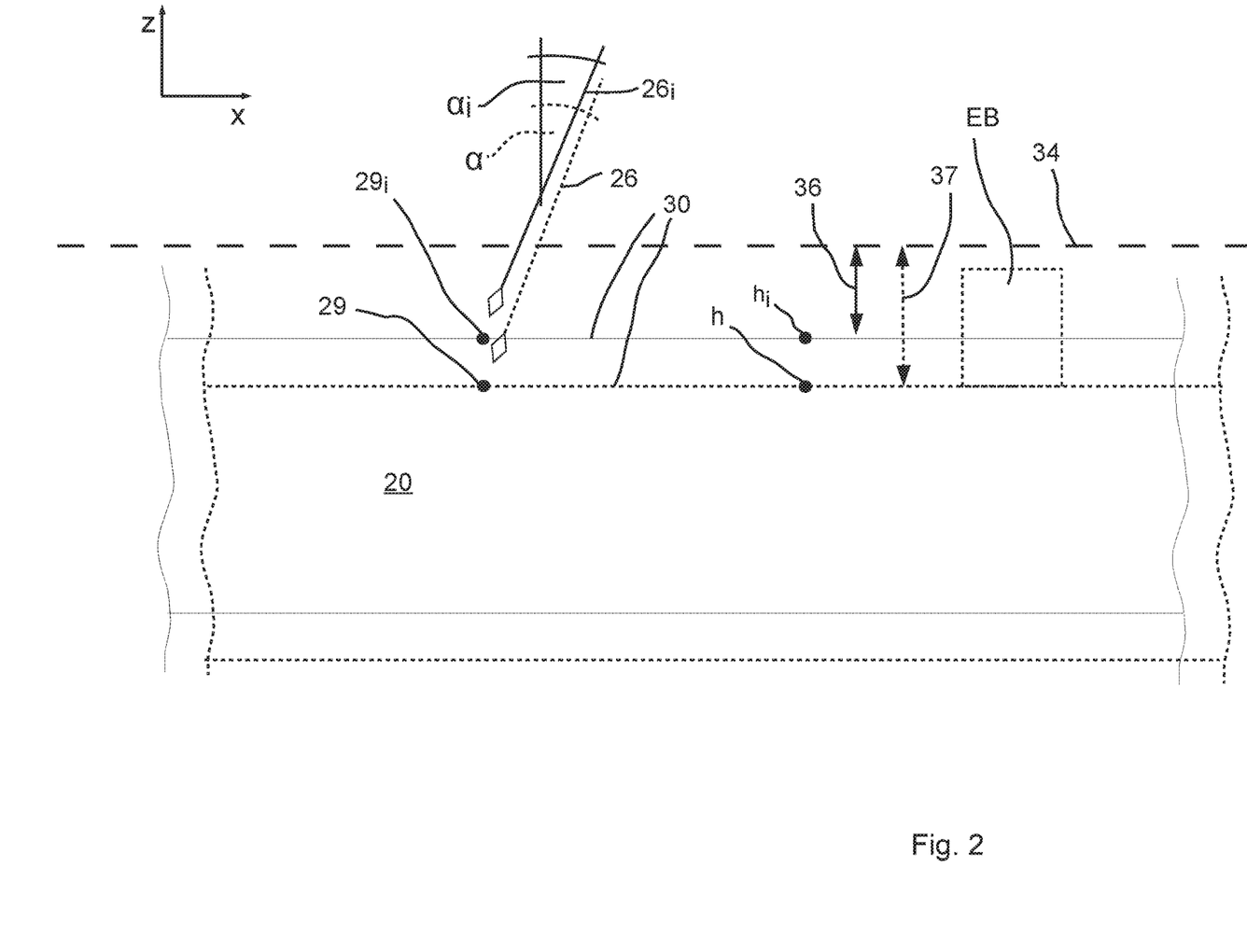
FIG. 2 shows a greatly enlarged section of the printed circuit board in FIG. 1 with an illustration of downward sagging of the printed circuit board in certain regions.

FIG. 2 illustrates downward lowering or sagging of the printed circuit board 20 in certain sections. Solid lines represent a part of the printed circuit board 20 in the ideal situation, that is to say without distortion, while dashed lines represent the real situation with a downwardly offset part of the printed circuit board 20. As a result, the top side 30 of the printed circuit board 20 in the ideal situation has a considerably shorter distance from the base height 34 according to the double-headed arrow 36 than in the illustrated real situation, see distance according to double-headed arrow 37. Consequently, a reference point H on the top side 30 is lowered as a result of the downward distortion or bending of the printed circuit board 20. Therefore, a reference point $h_i$ for the ideal situation and the same, but lowered, reference point h as the real situation are illustrated in FIG. 2. By way of example, FIG. 2 illustrates the test tip 26 which is intended to touch the contact point 29. Without considering the lowering of the printed circuit board 20, the test tip 26 in FIG. 2 would have approached the ideal position of the test tip $26_i$ and would have to approach the ideal position of the contact point $29_i$. However, on account of the lowering of the printed circuit board 20, the contact point 29 is below the ideal position of the contact point $29_i$, with the result that the position of the test tip 26 must be repositioned. Otherwise, there would not be any contact between the test tip 26 and the contact point 29.

On account of the required repositioning or adjustment of the Z position of the test tip 26, a differing angle α with respect to the vertical (with respect to the Z direction) may also arise. In the case of a printed circuit board which does not have any distortion or has not been lowered, the test tip $26_i$ in the ideal position would have an angle $α_i$ with respect to the vertical (Z coordinate) which is greater here than the angle α. In connection with the illustration of the test tips 25-28, it is assumed that they are moved to the contact point 29 to be touched at least in the last part of their movement in their longitudinal direction. The test tips 25-28 may be additionally moved in different directions.

Figure 3:
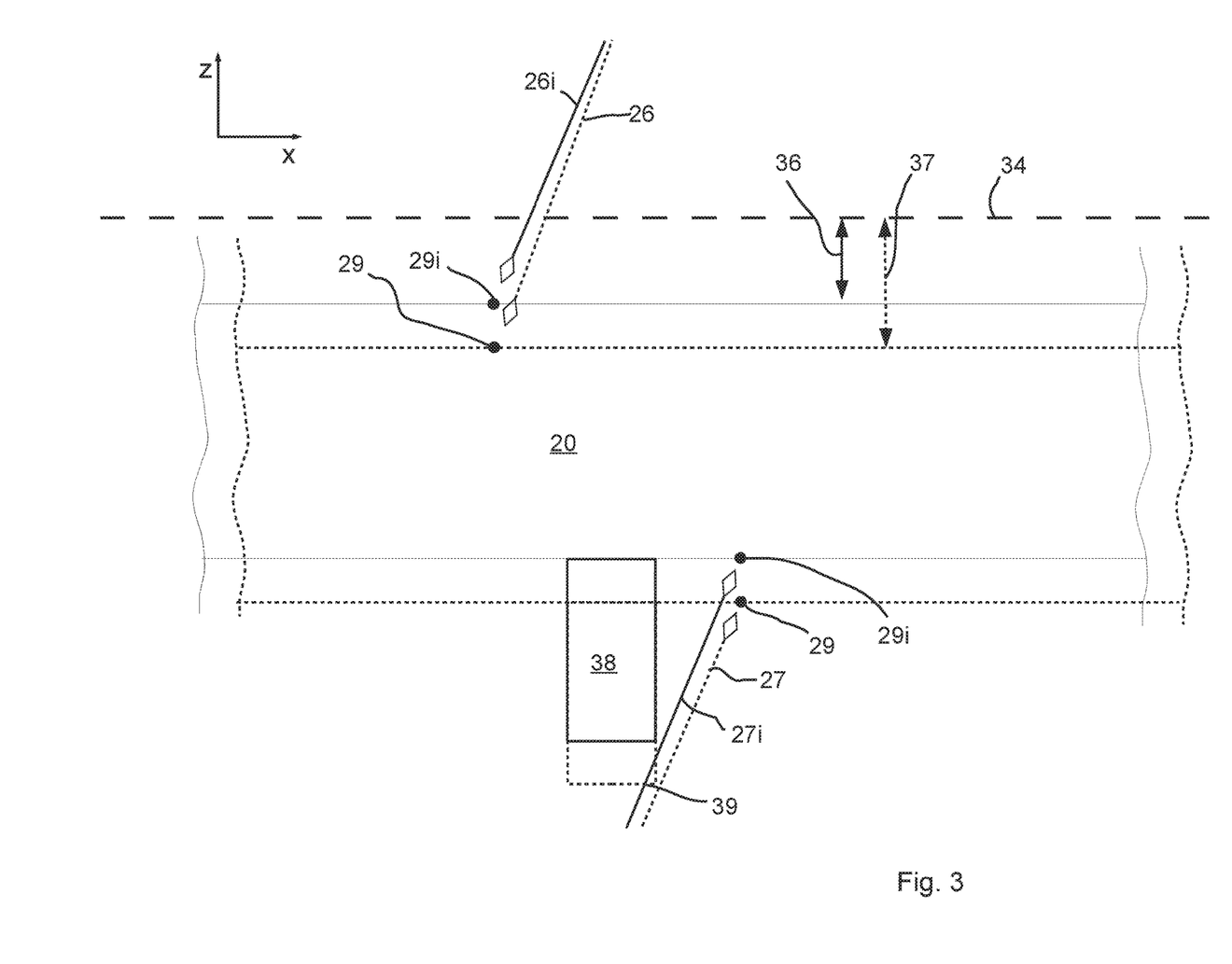
FIG. 3 shows an illustration similar to FIG. 2 with an electronic component on an underside of the printed circuit board.

In addition to missing the contact point 29 on account of the distortion/lowering of the printed circuit board 20, as described on the basis of FIG. 2, further faults may occur. For example, a larger component 38 (or component EB) may be arranged on the printed circuit board 20 and, in the case of an ideal printed circuit board 20 without distortion, is not in the way of the test tip $27_i$ in the ideal position. However, on account of the real position of the section of the printed circuit board 20, as illustrated using dashed lines in FIG. 3, the component 38 is in the movement space of the test tip $27_i$, with the result that at least touching is possible, see touch point 39. This can be avoided by shifting the test tip from the ideal position illustrated on the basis of the numeral $27_i$ into the real position of the test tip illustrated with dashed lines on the basis of the numeral 27.

The test apparatus provided here takes into account the distortion of the printed circuit board 20 when positioning the test tips 25-28. In this case, the real Z positions of the contact points 29, namely the test heights, are determined by means of interpolation.

Figure 4:
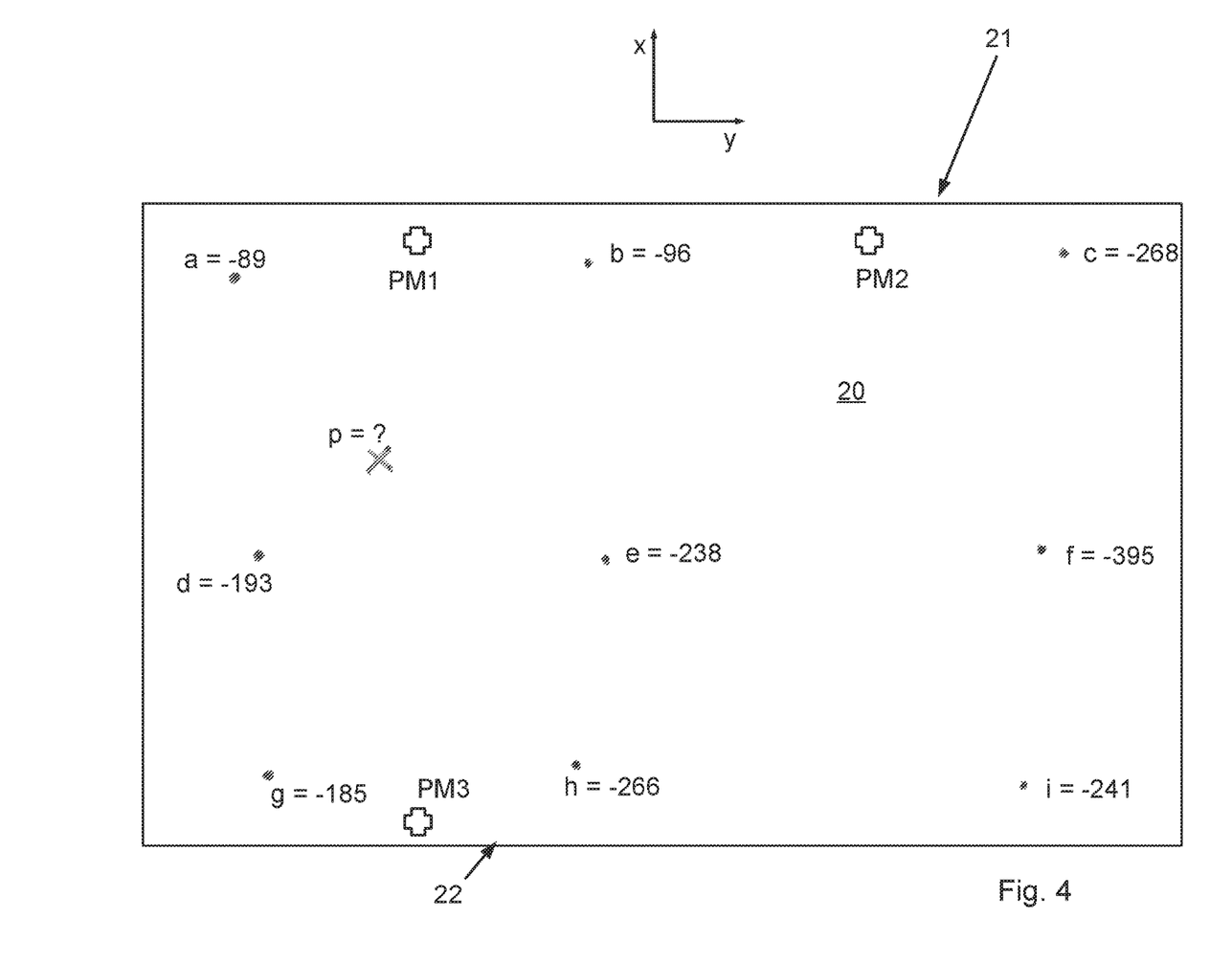
FIG. 4 shows a plan view of the printed circuit board to be tested with an indication of three fiducial marks, nine reference points and one contact point to be tested.

As described above, the fiducial marks PM1, PM2, PM3 are first of all captured by the camera K. The associated positions in the X and Y directions are registered in the controller S.

Selected reference points a, b, c, d, e, f, g, h, i, the position of which on the printed circuit board relative to the fiducial marks is known, are present on the printed circuit board 20. The heights of the reference points a-i are first of all determined by means of measurement. For this purpose, the laser measurement head 32 moves above each of the reference points a-i and measures their height. On account of the predefined relative arrangement, a height of the reference points a-i relative to the base height 34 can be determined from the measurements. On account of the predefined arrangement here, the heights determined in this manner are each negative values.

For simplification, it can be assumed that the reference points a-i and contact points 29 on the printed circuit board 20 do not rise above the surface (top side 30). If heights of reference points and contact points relative to the printed circuit board 20 differ in a known manner, the differences can be concomitantly taken into account in the interpolation. A contact point can therefore be on a component of a known dimension. The height of the component above the printed circuit board 20 can be concomitantly included in the interpolation as a constant.

FIGS. 4-10 indicate the heights relative to the base height 34 in micrometers, by way of example. For the sake of simplicity, the letters a-i relate both to the reference points themselves and to the heights of the reference points relative to the base height 34. The reference point a therefore has a height of −89 μm, the reference point b has a height of −96 μm and so on. All reference points a-i are intended to be provided here on the top side 30. Corresponding positions on the underside 31 can be calculated from the known thickness of the printed circuit board 20. Alternatively or additionally, a laser distance measurement device (not shown) can scan the underside 31.

The interpolation of the height of a contact point, which is referred to here as the test point p with the test height p, is explained by way of example below.

Figure 5:
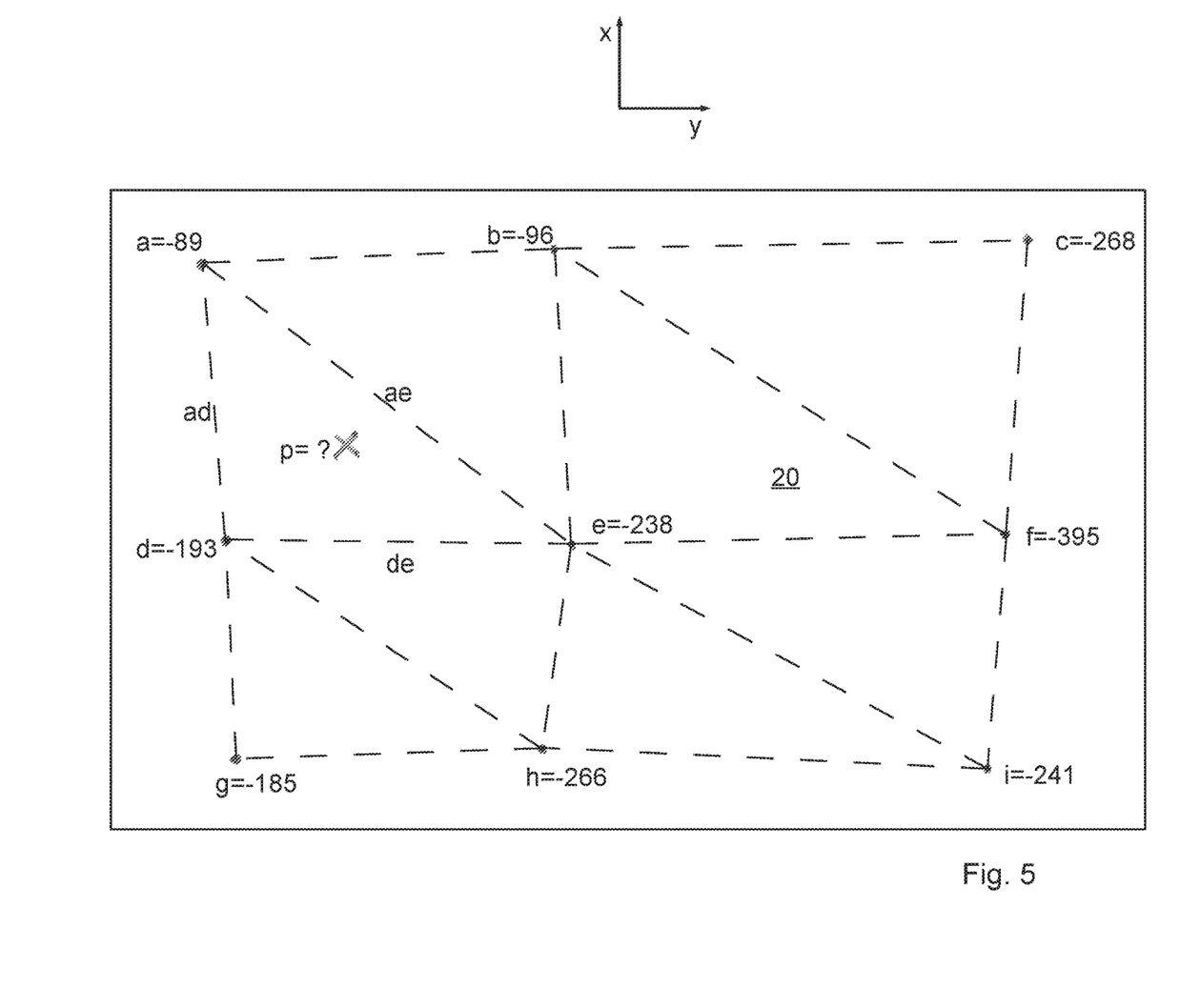
FIGS. 5-9 show a graphical illustration of the sequence of steps for interpolating the height of the contact point to be tested.

The reference points a-i are first of all connected to one another by means of a triangulation, see FIG. 5. Connecting lines formed in this manner are denoted by means of two letters which denote the start and end points. The reference points a and e are thus connected by a connecting line ae. For the sake of simplicity, only the connecting lines ad, ae and de are individually denoted. The test point p with the unknown height p is between the connecting lines ad, ae, de. A so-called Delaunay triangulation is preferably carried out, for instance using software which is available on the Internet at the link http://www.cs.cmu.edu/~quake/triangle.html, or in another manner.

A cell containing the test point p is deliberately formed here by the connecting lines ad, ae and de. Alternatively, a cell with lines between the reference points b, d, e could have been formed. This was rejected since a diagonal line between the reference points b, d in the square of the reference points a, b, d, e would have had a shorter distance to the test point b than the diagonal connecting line ae. The unknown test height of the test point p is now calculated by means of an NNI algorithm (NNI=natural neighbor interpolation). The interpolation method is fundamentally known and is also referred to as Voronoi interpolation or Sibson interpolation.

Figure 6:
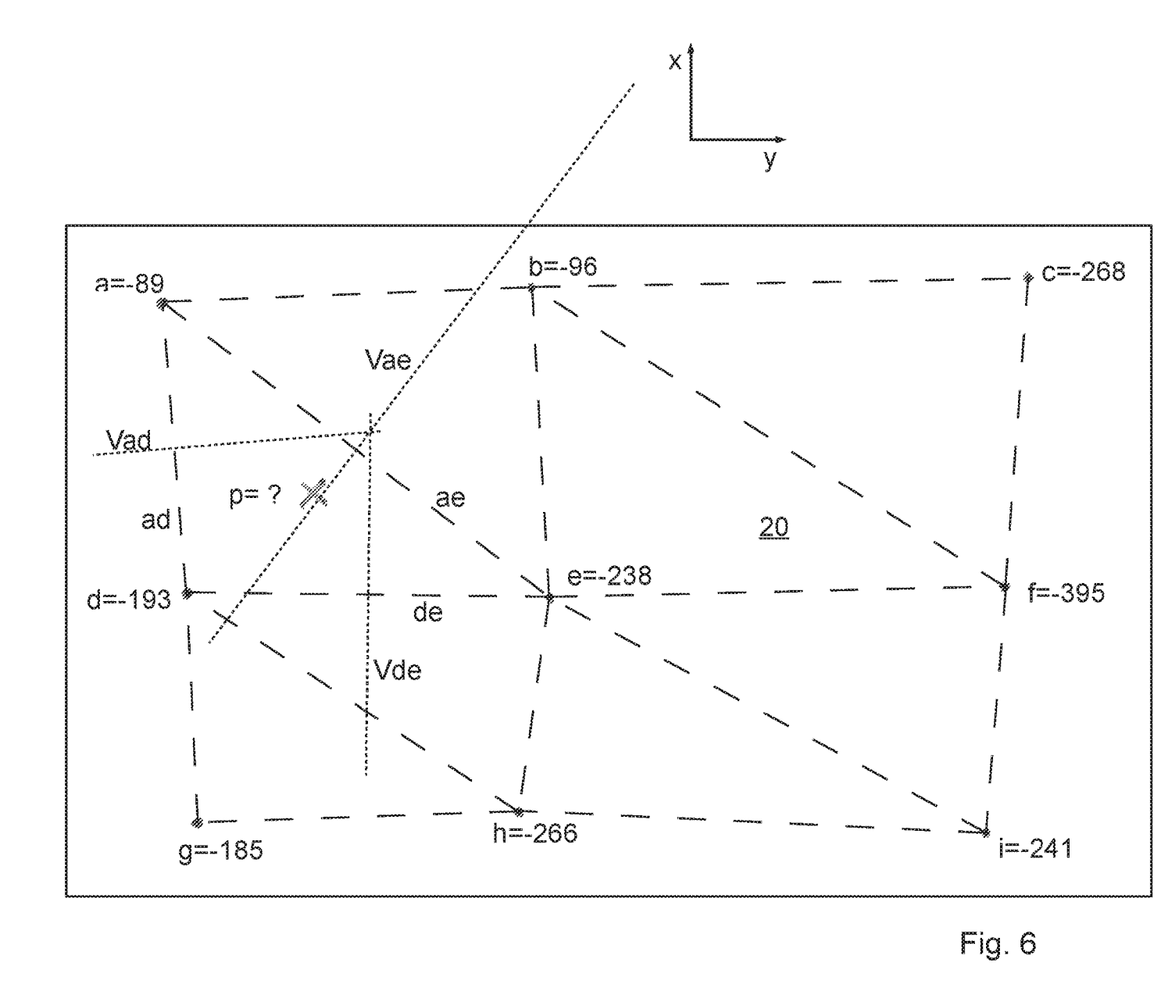

Proceeding from the connecting lines ad, ae and de around the test point p, perpendicular lines $V_{ad}$, $V_{ae}$ and $V_{de}$ each at half the length of the connecting lines are determined in the next step, so-called perpendicular bisectors, see FIG. 6.

Figure 7:
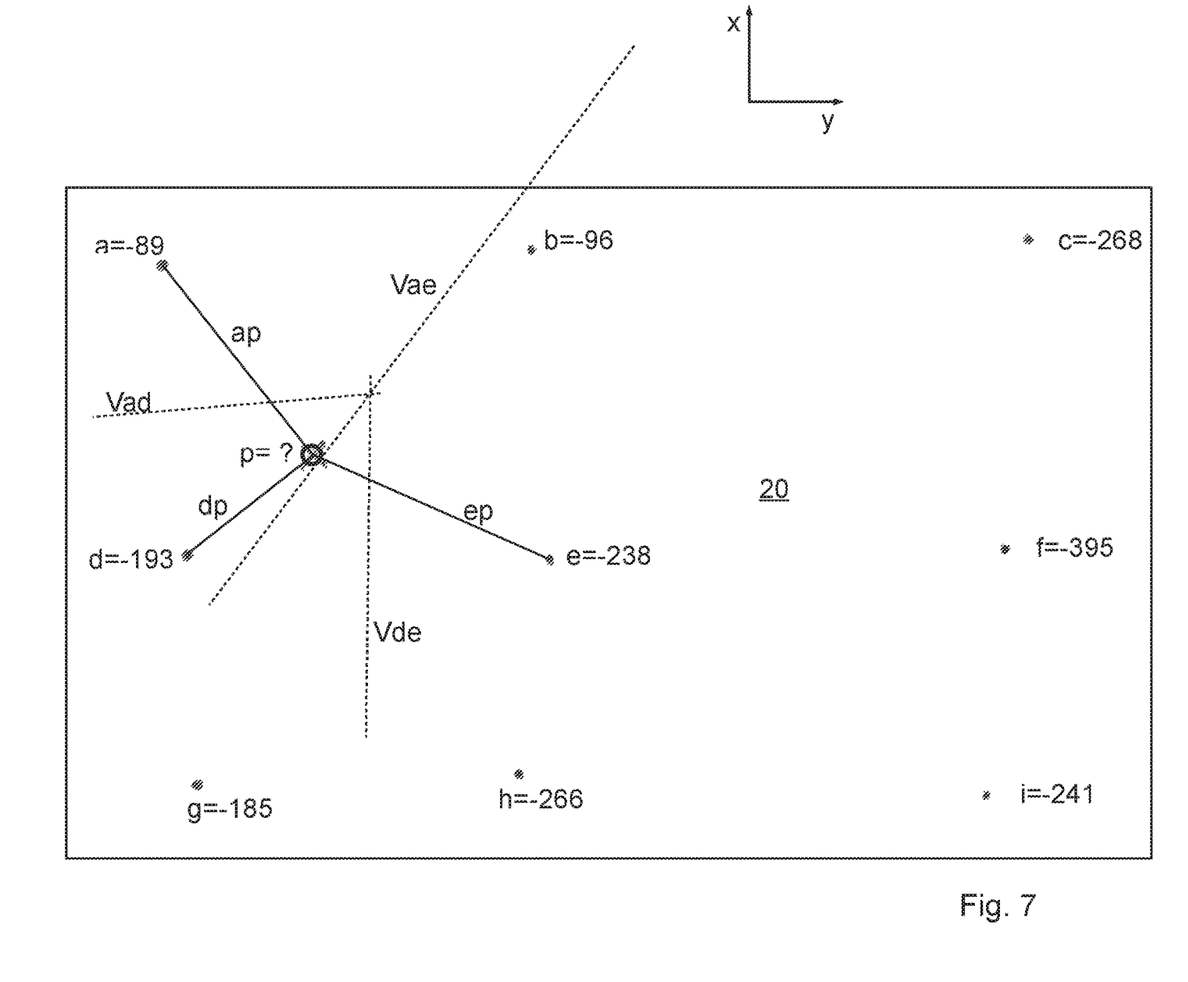

In a next step, connecting lines ap, dp and ep from the reference points a, d, e to the test point p are determined, see FIG. 7.

Figure 8:
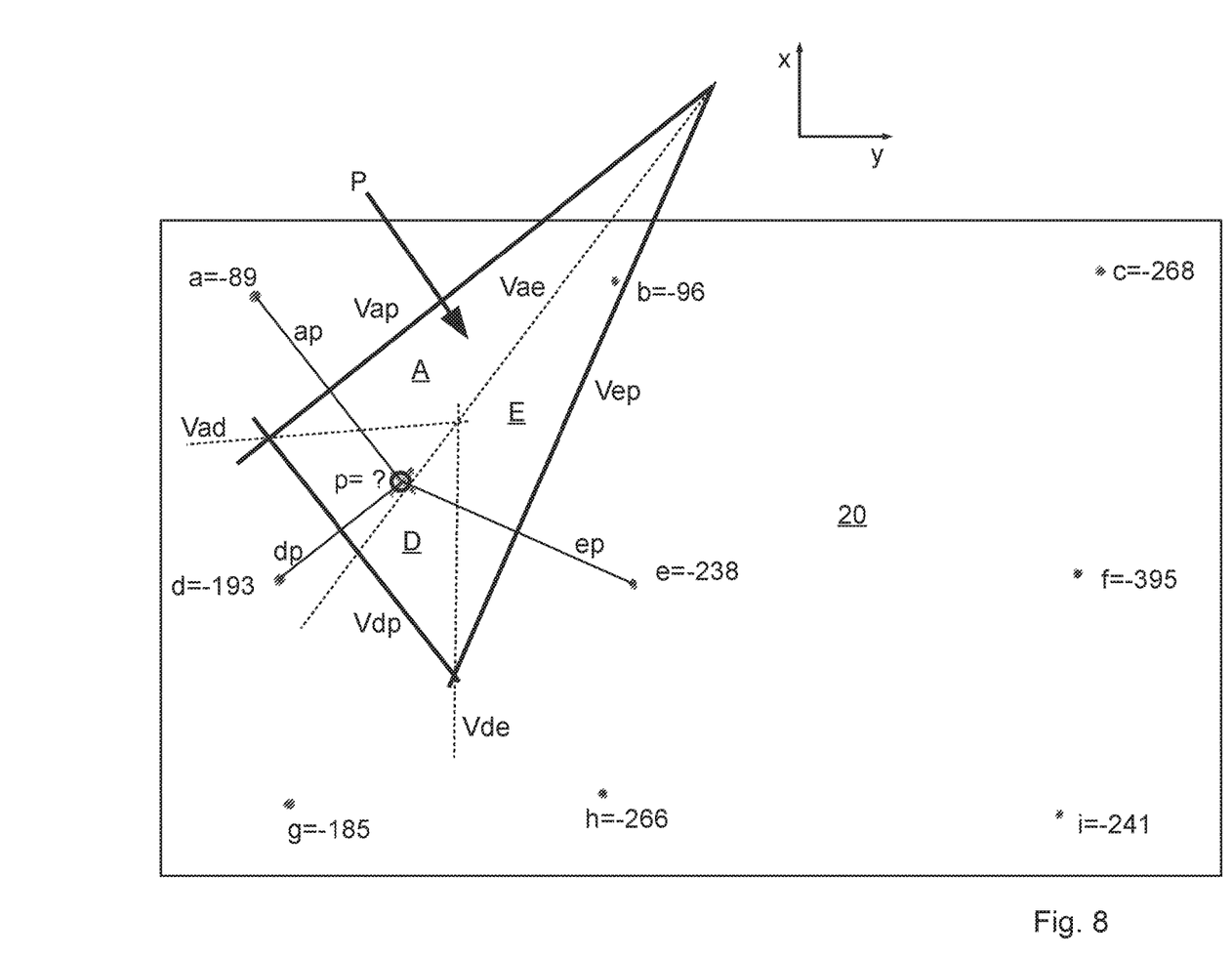

In a next step, perpendicular bisectors $V_{ap}$, $V_{dp}$ and $V_{ep}$ to the connecting lines ap, dp, ep are determined, each with an identical distance to the respective end points, see FIG. 8. In this manner, a large triangular cell P is formed by the perpendicular bisectors $V_{ap}$, $V_{dp}$ and $V_{ep}$, in which cell the test point p with its unknown height p lies. At the same time, the large cell P is subdivided into three small cells A, D, E by the perpendicular bisectors $V_{ad}$, $V_{ae}$ and $V_{de}$, see FIGS. 8 and 9. In this case, the small cell A faces the reference point a, the small cell D faces the reference point d and the small cell E faces the reference point e. The letters A, D and E here represent not only the small cells designated in this manner, but also their area. This applies in a similar manner to the large cell P.

Figure 9:
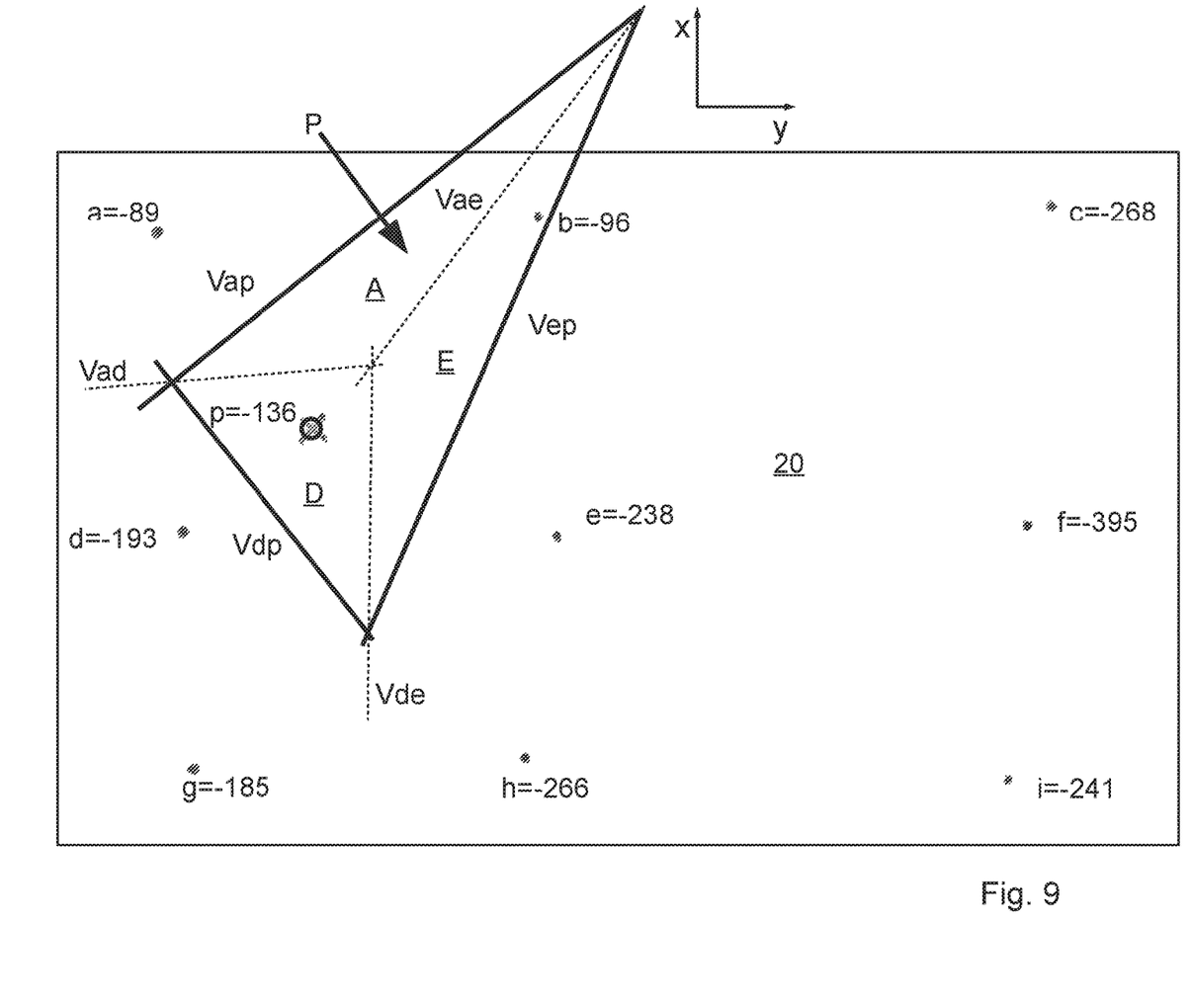

The unknown height p of the test point p is calculated by means of the NNI algorithm from area ratios and from the known heights of the reference points a, d and e, as follows:

$$A/P \times a + D/P \times d + E/P \times e = p$$

$$A/P \times -89 + D/P \times -193 + E/P \times -238 = p$$

In the present example, p=−136.

The described interpolation method with triangulation is carried out by the computer controller S or another control device and can take place in a considerably faster manner for each contact point than an exact height measurement.

Figure 10:
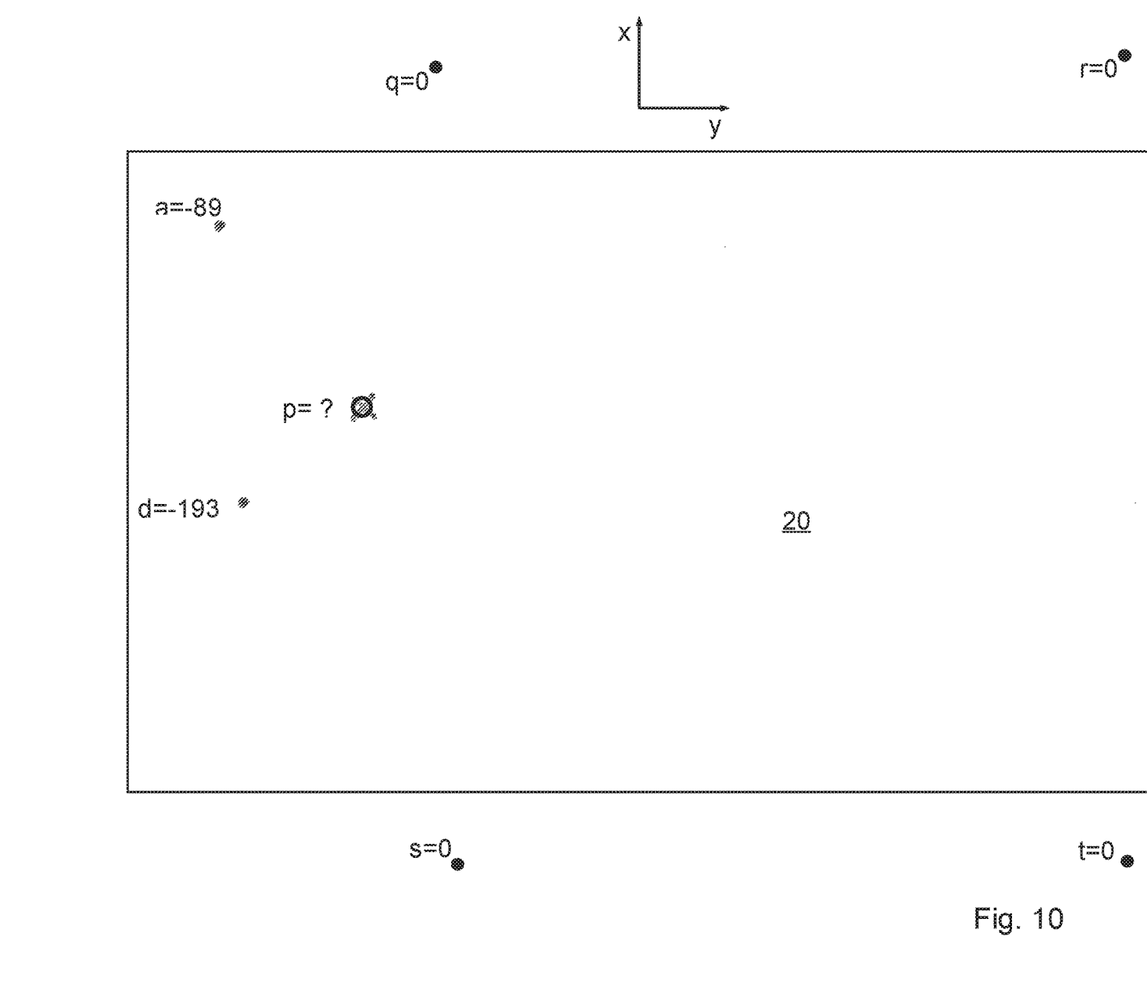
FIG. 10 shows an illustration similar to FIG. 4 but with four external reference points (outside the printed circuit board) and two internal reference points (on the printed circuit board).

The reference points a-i in FIGS. 4-9 are on the printed circuit board 20 and are therefore referred to here as internal reference points a-i. Reference points outside the printed circuit board 20, so-called external reference points q, r, s, t, are also possible, as depicted in FIG. 10. The external reference points are used, in particular, in the alternative when internal reference points cannot be measured in a sufficient number and/or at a suitable position. In this case, the height of the external reference points is arbitrarily but meaningfully predefined, each with the value 0 in FIG. 10.

A value which corresponds to the height of the printed circuit board 20 at the edges 21, 22, in particular on the top side 30, is preferably considered to be meaningful. An external reference point r or t is preferably selected and forms a cell, in particular a triangular cell, in which the test point p with the unknown test height p lies, with the reference points a, d which are also present here.

LIST OF REFERENCE SIGNS

| | |
|---|---|
| 20 | Printed circuit board |
| 21 | Edge |
| 22 | Edge |
| 23 | Bearing |
| 24 | Bearing |
| 25 | Test tip |
| 26 | Test tip |
| $26_i$ | Test tip (ideal) |
| 27 | Test tip |
| $27_i$ | Test tip (ideal) |
| 28 | Test tip |
| 29 | Contact point |
| $29_i$ | Contact point (ideal) |
| 30 | Top side |
| 31 | Underside |
| 32 | Laser measurement head |
| 33 | Plane |
| 24 | Base height |
| 35 | Doubled-headed arrow |
| 36 | Doubled-headed arrow |
| 37 | Doubled-headed arrow |
| 38 | Component |
| 39 | Touch point |
| α | Angle |
| $α_i$ | Angle (ideal) |
| a | Reference point and height |
| b | Reference point and height |
| c | Reference point and height |
| d | Reference point and height |
| e | Reference point and height |
| f | Reference point and height |
| g | Reference point and height |
| h | Reference point and height |
| $h_i$ | Reference point and height (ideal) |
| i | Reference point and height |
| p | Test point and height |
| q | Reference point and height |
| r | Reference point and height |
| s | Reference point and height |
| t | Reference point and height |
| ad | Connecting line |
| ae | Connecting line |
| de | Connecting line |
| ap | Connecting line |
| dp | Connecting line |
| ep | Connecting line |
| A | Small cell |
| D | Small cell |
| E | Small cell |
| K | Camera |
| P | Large cell |
| S | Computer controller |
| DS1 | Drive |
| DS2 | Drive |
| DS3 | Drive |
| DS4 | Drive |
| EB | Electronic components |
| PM1 | Fiducial mark |
| PM2 | Fiducial mark |
| PM3 | Fiducial mark |
| $V_{ad}$ | Perpendicular bisector |
| $V_{ae}$ | Perpendicular bisector |
| $V_{de}$ | Perpendicular bisector |
| $V_{ap}$ | Perpendicular bisector |
| $V_{dp}$ | Perpendicular bisector |
| $V_{ep}$ | Perpendicular bisector |

What is claimed:

1. A method for testing printed circuit boards in a test apparatus having a carrying apparatus for the printed circuit board and having a test module for measuring physical variables of components and contact points on the printed circuit board, wherein
    the width of the printed circuit board defines an X direction, its length defines a Y direction and its thickness defines a Z direction inside the test apparatus,
    reference points, X, Y and Z positions of which relative to the carrying apparatus are known, are present on the printed circuit board or outside the printed circuit board,
    the X and Y positions of the components and contact points relative to the reference points are known,
    the measurement of the physical variables depends on an actual Z position of the printed circuit board at the X and Y positions of the component or contact point to be measured, and
    the actual Z position of the printed circuit board at the X and Y positions of the component or contact point to be measured is determined by means of an interpolation method starting from the X, Y and Z positions of selected reference points.

2. The method as claimed in claim 1, wherein an NNI method is used as the interpolation method.

3. The method as claimed in claim 1, wherein a triangulation of reference points is carried out during the interpolation.

4. The method as claimed in claim 1, wherein at least three reference points are used for the interpolation.

5. The method as claimed in claim 4, wherein at least one external reference point and at least two internal reference points are used for the interpolation.

6. The method as claimed in claim 4, wherein at least one internal reference point and at least two external reference points are used for the interpolation.

7. The method as claimed in claim 1, wherein at least one of the reference points used for the interpolation is an internal reference point.

8. The method as claimed in claim 7, wherein the Z position of the internal reference point is determined by means of reference measurements.

9. The method as claimed in claim 8, wherein the Z position of the internal reference point is determined by means of laser distance measurements.

10. The method as claimed in claim 1, wherein at least one of the reference points used for the interpolation is an external reference point.

11. The method as claimed in claim 10, wherein a Z position corresponding to the carrying apparatus plus a constant is assumed for the external reference point.

12. The method as claimed in claim 1, wherein the printed circuit board is held in a horizontal orientation in the test apparatus during measurement.

13. The method as claimed in claim 1, wherein a test tip is used as the test module, which test tip touches the components or contact points and considers the interpolated actual Z position of the printed circuit board at this location for this purpose.

14. The method as claimed in claim 13, wherein the test tip approaches the components or contact points at an angle with respect to the Z direction.

15. The method as claimed in claim 1, wherein an optical distance measurement apparatus is used as the test module, which distance measurement apparatus determines a distance from the test module to the component or contact point in the Z direction, and wherein an actual height of the component or contact point in the Z direction relative to the printed circuit board is determined from the distance determined in this manner and the interpolated actual Z position of the printed circuit board.

16. The method as claimed in claim 1, wherein, before measuring the physical variables of components and contact points, fiducial marks present on the printed circuit board are detected and at least the X and Y positions of the fiducial marks are captured.

* * * * *